(12) United States Patent
Patil et al.

(10) Patent No.: US 11,552,015 B2
(45) Date of Patent: Jan. 10, 2023

(54) SUBSTRATE COMPRISING A HIGH-DENSITY INTERCONNECT PORTION EMBEDDED IN A CORE LAYER

(71) Applicant: QUALCOMM Incorporated, San Diego, CA (US)

(72) Inventors: Aniket Patil, San Diego, CA (US); Hong Bok We, San Diego, CA (US); Kuiwon Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 3 days.

(21) Appl. No.: 16/900,672

(22) Filed: Jun. 12, 2020

(65) Prior Publication Data
US 2021/0391247 A1 Dec. 16, 2021

(51) Int. Cl.
*H01L 23/528* (2006.01)
*H01L 23/00* (2006.01)
(Continued)

(52) U.S. Cl.
CPC ...... *H01L 23/528* (2013.01); *H01L 21/76838* (2013.01); *H01L 21/76895* (2013.01); *H01L 24/24* (2013.01); *H01L 24/25* (2013.01); *H01L 27/14636* (2013.01); *H01L 39/2454* (2013.01); *H01L 2224/0231* (2013.01); *H01L 2224/0233* (2013.01); *H01L 2224/16151* (2013.01); *H01L 2224/24151* (2013.01); *H01L 2224/821* (2013.01)

(58) Field of Classification Search
CPC ............ H01L 23/528; H01L 21/76939; H01L 21/76895; H01L 24/24; H01L 24/25; H01L 27/14636; H01L 39/2454; H01L 2224/0231; H01L 2224/0233; H01L 2224/16151

See application file for complete search history.

(56) References Cited

U.S. PATENT DOCUMENTS

2014/0118976 A1  5/2014  Yoshikawa et al.
2015/0371932 A1  12/2015  Hu
(Continued)

FOREIGN PATENT DOCUMENTS

WO    2018004618 A1    1/2018

OTHER PUBLICATIONS

International Search Report and Written Opinion—PCT/US2021/030839—ISA/EPO—dated Sep. 6, 2021.

*Primary Examiner* — Galina G Yushina
(74) *Attorney, Agent, or Firm* — Loza & Loza, LLP

(57) ABSTRACT

A substrate that includes a core layer comprising a first surface and a second surface, a plurality of core interconnects located in the core layer, a high-density interconnect portion located in the core layer, a first dielectric layer coupled to the first surface of the core layer, a first plurality of interconnects located in the first dielectric layer, a second dielectric layer coupled to the second surface of the core layer, and a second plurality of interconnects located in the second dielectric layer. The high-density interconnect portion includes a first redistribution dielectric layer and a first plurality of high-density interconnects located in the first redistribution dielectric layer. The high-density interconnect portion may provide high-density interconnects.

20 Claims, 14 Drawing Sheets

(51) Int. Cl.
    *H01L 27/146*    (2006.01)
    *H01L 39/24*     (2006.01)
    *H01L 21/768*    (2006.01)

(56) References Cited

U.S. PATENT DOCUMENTS

| | | |
|---|---|---|
| 2016/0307870 A1 | 10/2016 | Kelly et al. |
| 2017/0202083 A1* | 7/2017 | Baek .................... H05K 3/4694 |
| 2019/0148273 A1 | 5/2019 | Hu |
| 2019/0221447 A1* | 7/2019 | Chavali ............. H01L 23/49827 |
| 2020/0083179 A1* | 3/2020 | Lee ................... H01L 23/49894 |

* cited by examiner

SUBSTRATE COMPRISING A HIGH-DENSITY INTERCONNECT PORTION EMBEDDED IN A CORE LAYER

FIELD

Various features relate to substrates, but more specifically to a substrate that includes a high density interconnect portion embedded in a core layer.

BACKGROUND

FIG. 1 illustrates a device 100 that includes a substrate 102, an integrated device 104 and an integrated device 106. The substrate 102 includes at least one dielectric layer 120, a plurality of interconnects 122 and a plurality of solder interconnects 124. A plurality of solder interconnects 144 is coupled to the substrate 102 and the integrated device 104. A plurality of solder interconnects 164 is coupled to the substrate 102 and the integrated device 106. Fabricating a small device that includes a substrate with high density interconnects can be challenging. There is an ongoing need to provide more compact devices that can accommodate high density interconnects and/or high pin counts.

SUMMARY

Various features relate to substrates, but more specifically to a substrate that includes a high-density interconnect portion embedded in a core layer.

One example provides a substrate that includes a core layer comprising a first surface and a second surface, a plurality of core interconnects located in the core layer, a high-density interconnect portion located in the core layer, a first dielectric layer coupled to the first surface of the core layer, a first plurality of interconnects located in the first dielectric layer, a second dielectric layer coupled to the second surface of the core layer, and a second plurality of interconnects located in the second dielectric layer.

Another example provides an apparatus that includes an integrated device and a substrate coupled to the integrated device. The substrate includes a core layer comprising a first surface and a second surface, means for core interconnection located in the core layer, means for high-density interconnection located in the core layer, a first dielectric layer coupled to the first surface of the core layer, means for first interconnection located in the first dielectric layer, a second dielectric layer coupled to the second surface of the core layer, and means for second interconnection located in the second dielectric layer.

Another example provides a method for fabricating a substrate. The method provides a core layer comprising a first surface and a second surface. The method forms a plurality of core interconnects in the core layer. The method forms a high-density interconnect portion in the core layer. The method forms a first dielectric layer over the first surface of the core layer. The method forms a second dielectric layer over the second surface of the core layer. The method forms a first plurality of interconnects in the first dielectric layer. The method forms a second plurality of interconnects in the second dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate that includes a core layer comprising a first surface (e.g., top surface) and a second surface (e.g., bottom surface). The substrate includes a plurality of core interconnects located in the core layer, a first dielectric layer (e.g., first prepreg layer) coupled to the first surface of the core layer, a first plurality of interconnects located in the first dielectric layer, a second dielectric layer (e.g., second prepreg layer) coupled to the second surface of the core layer, and a second plurality of interconnects located in the second dielectric layer. The substrate includes a high-density interconnect portion (e.g., redistribution portion) located in the core layer. The high-density interconnect portion may include a dielectric layer (e.g., redistribution dielectric layer, photo imageable dielectric (PID), PID polymer) and a plurality of high-density interconnects (e.g., redistribution interconnects) located in the redistribution dielectric layer (e.g., PID). The high-density interconnect portion may be a portion of the substrate that is configured to have interconnects with a lower minimum pitch than the minimum pitch of interconnects from other portions of the substrate. The high-density interconnect portion may help reduce congestion in the substrate and may enable a substrate to have a small and compact form factor, while also providing a high input/output (I/O)

pin count. The substrate may be a laminate substrate. The substrate may be coupled to an integrated device.

Figure 1:
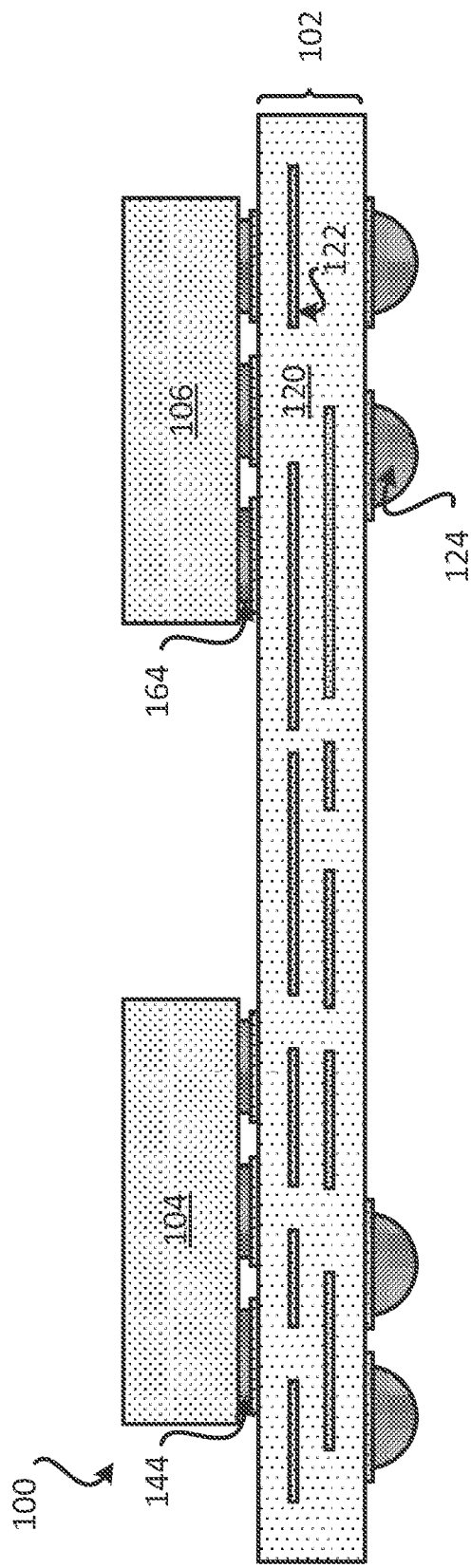
FIG. 1 illustrates a profile view of integrated devices coupled to a substrate.
Figure 2:
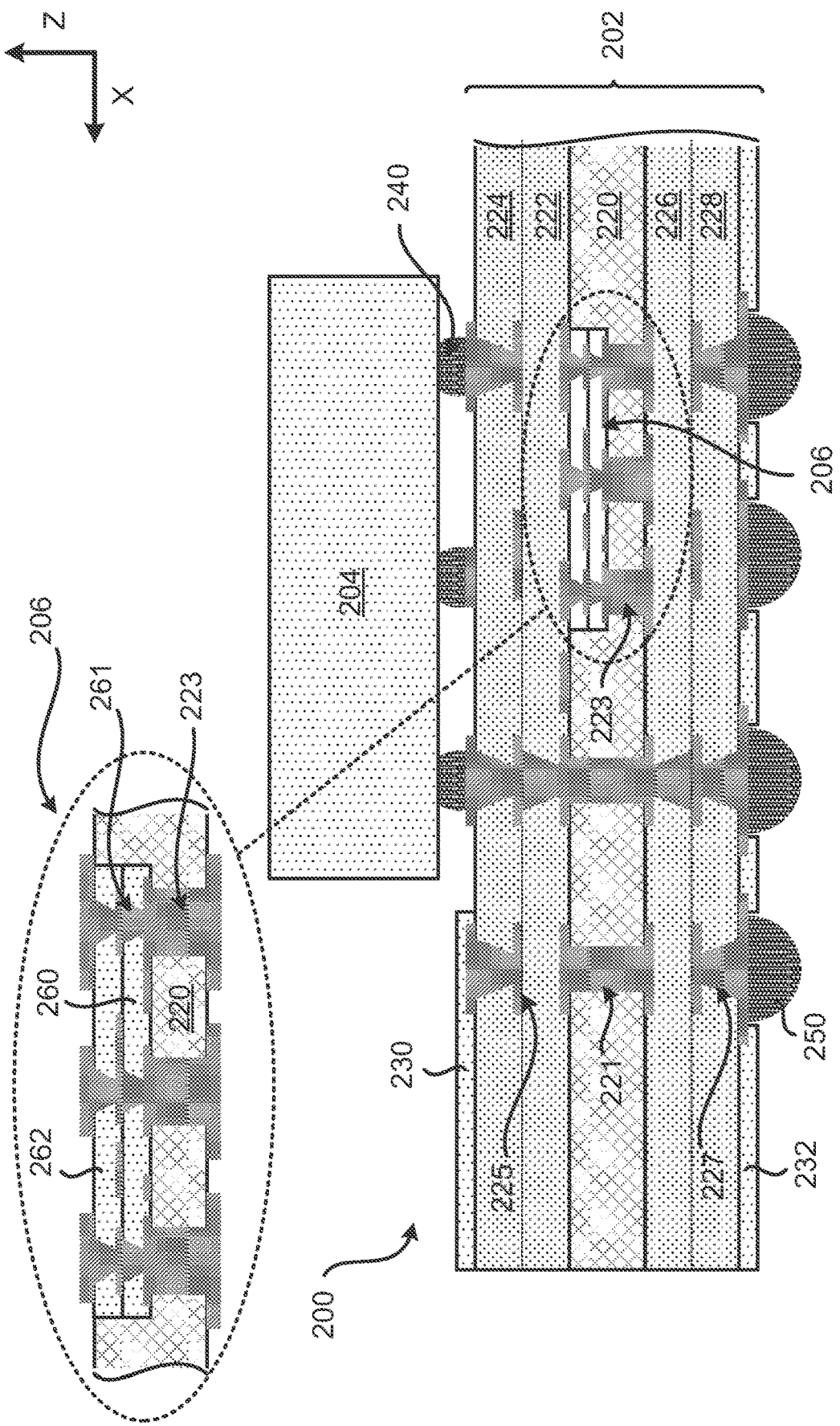
FIG. 2 illustrates a profile view of an integrated device coupled to a substrate that includes a high-density interconnect portion embedded in a core layer.

Exemplary Packages that Include a Substrate Comprising a High-Density Portion Embedded in a Core Layer FIG. 2 illustrates a profile view of a package 200 that includes a substrate comprising a high-density interconnect portion embedded and located in a core layer. The package 200 includes a substrate 202 and an integrated device 204. The integrated device 204 is coupled to the substrate 202 through the plurality of solder interconnects 240. The substrate 202 may be a laminate substrate that includes a core layer.

The substrate 202 includes a core layer 220, a dielectric layer 222, a dielectric layer 224, a dielectric layer 226, a dielectric layer 228, a high-density interconnect portion 206, a first plurality of core interconnects 221, a second plurality of core interconnects 223, a first plurality of interconnects 225, a second plurality of interconnects 227, a first solder resist layer 230, and a second solder resist layer 232. The core layer 220 may include glass or glass fiber with resin. However, the core layer 220 may include different materials. The dielectric layers 222, 224, 226, and/or 228 may each include prepreg (e.g., a prepreg layer). The dielectric layers 222, 224, 226, and/or 228 may be build up layers. The dielectric layers 222, 224, 226, and/or 228 may include a different material than the core layer 220. The substrate 202 includes four (4) dielectric layers. However, the substrate 202 may include a different number of dielectric layers (e.g., at least one dielectric layer, more than four dielectric layers).

The core layer 220 includes a first surface (e.g., top surface) and a second surface (e.g., bottom surface). The dielectric layer 222 is coupled to the first surface of the core layer 220. The dielectric layer 224 is coupled to the dielectric layer 222. The substrate 202 includes a first plurality of interconnects 225 located in and/or over the dielectric layer 222 and/or the dielectric layer 224. The first plurality of interconnects 225 may be means for first interconnection. The dielectric layer 226 is coupled to the second surface of the core layer 220. The dielectric layer 228 is coupled to the dielectric layer 226. The substrate 202 includes a second plurality of interconnects 227 located in and/or over the dielectric layer 226 and/or the dielectric layer 228. The second plurality of interconnects 227 may be means for second interconnection.

The core layer 220 includes the first plurality of core interconnects 221 and the second plurality of core interconnects 223. The first plurality of core interconnects 221 and/or the second plurality of core interconnects 223 may be referred as a plurality of core interconnects. A plurality of core interconnects (e.g., 221, 223) may be means for core interconnection. The high-density interconnect portion 206 is located in the core layer 220. The high-density interconnect portion 206 may be a redistribution portion. The high-density interconnect portion 206 is embedded through the first surface of the core layer 220. The first plurality of core interconnects 221 travels through the core layer 220. The second plurality of core interconnects 223 is located in the core layer 220 and is coupled to the high-density interconnect portion 206. The second plurality of core interconnects 223 travels from the second surface of the core layer 220 to the high-density interconnect portion 206.

The high-density interconnect portion 206 is at least partially located in the core layer 220. The high-density interconnect portion 206 is configured to provide high density interconnects for the substrate 202. The high-density interconnect portion 206 includes a first dielectric layer 260 (e.g., first redistribution dielectric layer, first in-core dielectric layer), a second dielectric layer 262 (e.g., second redistribution dielectric layer, second in-core dielectric layer), and a plurality of high-density interconnects 261. The plurality of high-density interconnects 261 may include a plurality of redistribution interconnects. The high-density interconnect portion 206 may be means for high density interconnection. The high-density interconnect portion 206 may be means for redistribution interconnection. The plurality of high-density interconnects 261 may be located in the first dielectric layer 260 and/or the second dielectric layer 262. The plurality of high-density interconnects 261 is coupled to the second plurality of core interconnects 223 and the first plurality of interconnects 225.

The high-density interconnect portion 206 may be fabricated using a redistribution layer (RDL) fabrication process (e.g., non-mSAP process, non-SAP process). When a RDL fabrication process is used to fabricate the high-density interconnect portion 206, the thickness of each of the dielectric layers (e.g., 260, 262) may be approximately 5-10 micrometers (μm), and the thickness of each of the high-density metal layers (on which high-density interconnects are formed) may be approximately 5-10 micrometers (μm). The high-density metal layers may be redistribution metal layers. In some implementations, the second minimum line and spacing (L/S) for the plurality of high-density interconnects 261, is in a range of approximately 2/2-20/20 micrometers (μm). As mentioned above, the high-density interconnects of the high-density interconnect portion 206 may have higher density (e.g., lower minimum pitch and/or lower minimum L/S) than the interconnects (e.g., core interconnects) of other portions of the substrate 202.

The first plurality of core interconnects 221, the second plurality of core interconnects 223, the first plurality of interconnects 225, and/or the second plurality of interconnects 227 may include a first minimum pitch. The plurality of high-density interconnects 261 may include a second minimum pitch that is less than the first minimum pitch. The first plurality of core interconnects 221, the second plurality of core interconnects 223, the first plurality of interconnects 225, and/or the second plurality of interconnects 227 may have a first minimum pitch and a first minimum line and spacing (L/S). In some implementations, the first minimum pitch for the first plurality of core interconnects 221, the second plurality of core interconnects 223, the first plurality of interconnects 225, and/or the second plurality of interconnects 227, is in a range of approximately 50-200 micrometers (μm).

At least one electrical current may travel through the high-density interconnect portion 206 differently. For example, at least one electrical current may travel between the first plurality of interconnects 225 and the second plurality of interconnects 227, through the plurality of high-density interconnects 261 and the second plurality of core interconnects 223. In another example, the high-density interconnect portion 206 may be configured as a bridge (e.g., core bridge, internal bridge) where at least one electrical current may travel from the first plurality of interconnects 225, through the plurality of high-density interconnects 261, and back through the first plurality of interconnects 225. The above description of how at least one electrical current may travel in a substrate may be applicable to any of the high-density interconnect portions described in the disclosure.

The high-density interconnect portion 206, which has higher density interconnects, may allow the package 200 to provide higher I/O pin counts, without having to increase the size of the package 200. For example, using the high-density interconnect portion 206 may allow the substrate 202 to have a lower number of metal layers, which may help reduce the overall height of the package 200. One or more high-density interconnect portions (e.g., 206) may help reduce congestion and/or entanglement in certain regions (e.g., regions near an integrated device) of the substrate 202 due to the high number of pin count and/or number of netlists.

One advantage of a high-density interconnect portion, may be the ability of the high-density interconnect portion to handle and deal with routing entanglement and/or routing congestion for the package and substrate. In some implementations, complicated, tight and/or difficult routing of interconnects may be done in the high-density interconnect portion (e.g., 206). For example, routing entanglement and/or crossing of interconnects for different signals may be done in the high-density interconnect portion 206 (e.g., redistribution portion).

This exemplary configuration helps save space and helps reduce the overall height and footprint of the substrate 202, by reducing the number of metal layers of the substrate 202 and/or reducing routing congestion in the substrate 202. The end result, is a substrate and a package with a more compact form factor.

The first solder resist layer 230 is coupled to a first surface (e.g., top surface) of the substrate 202. For example, the first solder resist layer 230 may be coupled to the dielectric layer 224. The second solder resist layer 232 is coupled to a second surface (e.g. bottom surface) of the substrate 202. For example, the second solder resist layer 232 may be coupled to the dielectric layer 228.

A plurality of solder interconnects 250 is coupled to the substrate 202. For example, the plurality of solder interconnects 250 may be coupled to the second plurality of interconnects 227 of the substrate 202. The substrate 202 may be coupled to a board (e.g., printed circuit board) through the plurality of solder interconnects 250. The integrated device 204 is coupled to the first plurality of interconnects 225 through the plurality of solder interconnects 240.

The integrated device 204 may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon (Si) based integrated device, a silicon carbide (SiC) based integrated device, processor, memory and/or combinations thereof. An integrated device (e.g., 204) may include at least one electronic circuit (e.g., first electronic circuit, second electronic circuit, etc. . . . ).

Different implementations may couple different components to the substrate 202. Other components (e.g., surface mounted components) that may be coupled to the substrate 202 include a passive device (e.g., capacitor).

Figure 3:
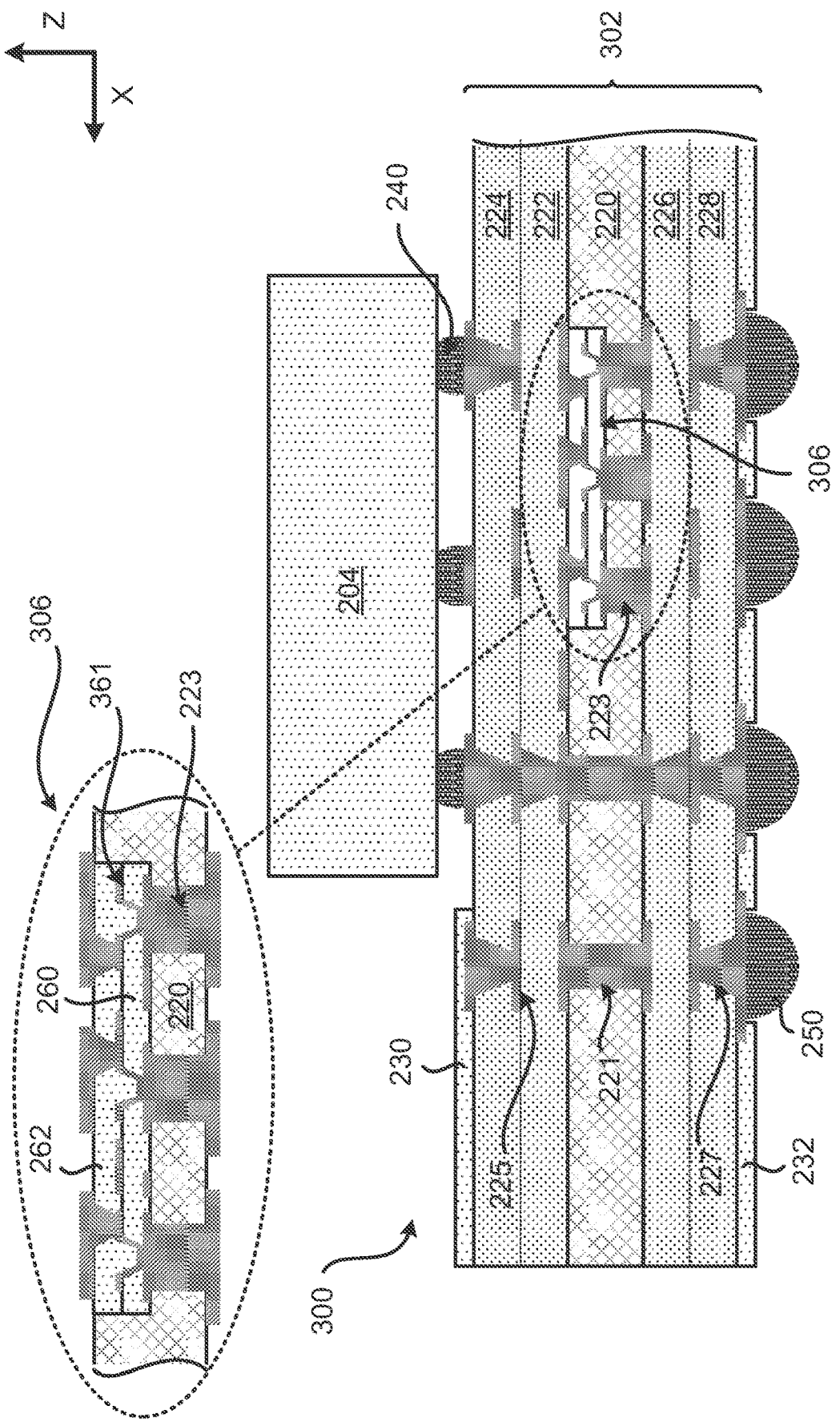
FIG. 3 illustrates a profile view of an integrated device coupled to another substrate that includes a high-density interconnect portion embedded in a core layer.

FIG. 3 illustrates a profile view of a package 300 that includes a substrate comprising a high-density interconnect portion located in a core layer. The package 300 is similar to the package 200 of FIG. 2 and includes the same or similar components as the package 200. The package 300 includes a substrate 302 and the integrated device 204. The integrated device 204 is coupled to the substrate 302 through the plurality of solder interconnects 240. The substrate 302 may be a laminate substrate that includes a core layer. As will be further described below, some of the redistribution interconnects of FIG. 3, may have different shapes than the high-density interconnects of FIG. 2.

The substrate 302 is similar to the substrate 202 and thus includes the same or similar components as the substrate 202. The substrate 302 includes a high-density interconnect portion 306. The high-density interconnect portion 306 is at least partially located in the core layer 220. The high-density interconnect portion 306 is configured to provide high density interconnects for the substrate 202. The high-density interconnect portion 306 includes the first dielectric layer 260 (e.g., first redistribution dielectric layer, first in-core dielectric layer), the second dielectric layer 262 (e.g., second redistribution dielectric layer, second in-core dielectric layer), and a plurality of high-density interconnects 361. The high-density interconnect portion 306 may be means for high-density interconnection. The high-density interconnect portion 306 may be means for redistribution interconnection. The plurality of high-density interconnects 361 is located in the first dielectric layer 260 and/or the second dielectric layer 262. The plurality of high-density interconnects 361 is coupled to the second plurality of core interconnects 223 and the first plurality of interconnects 225. The plurality of high-density interconnects 361 may be similar to the plurality of high-density interconnects 261. However, in some implementations, at least some of the plurality of high-density interconnects 361 may include a U-shape or V-shape. For example, at least some of the plurality of high-density interconnects 361 may include a U-shape interconnect or a V-shape interconnect. The terms "U-shape" and" V-shape" shall be interchangeable. The terms "U-shape" and "V-shape" may refer to the side profile shape of the interconnects and/or high-density interconnects (e.g., redistribution interconnects). The U-shape interconnect and the V-shape interconnect may have a top portion and a bottom portion. A bottom portion of a U-shape interconnect (or a V-shape interconnect) may be coupled to a top portion of another U-shape interconnect (or a V-shape interconnect).

The high-density interconnect portion 306 may be fabricated using a redistribution layer (RDL) fabrication process. When a RDL fabrication process is used to fabricate the high-density interconnect portion 306, the thickness of each of the dielectric layers (e.g., 260, 262) may be approximately 5-10 micrometers (μm), and the thickness of each of the high-density metal layers (on which high-density interconnects are formed) may be approximately 5-10 micrometers (μm). In some implementations, the second minimum line and spacing (L/S) for the plurality of high-density interconnects 361, is in a range of approximately 2/2-20/20 micrometers (μm). As mentioned above, the high-density interconnects of the high-density interconnect portion 306 may have higher density (e.g., lower minimum pitch and/or lower minimum L/S) than the interconnects (e.g., core interconnects) of other portions of the substrate 302.

Figure 4:
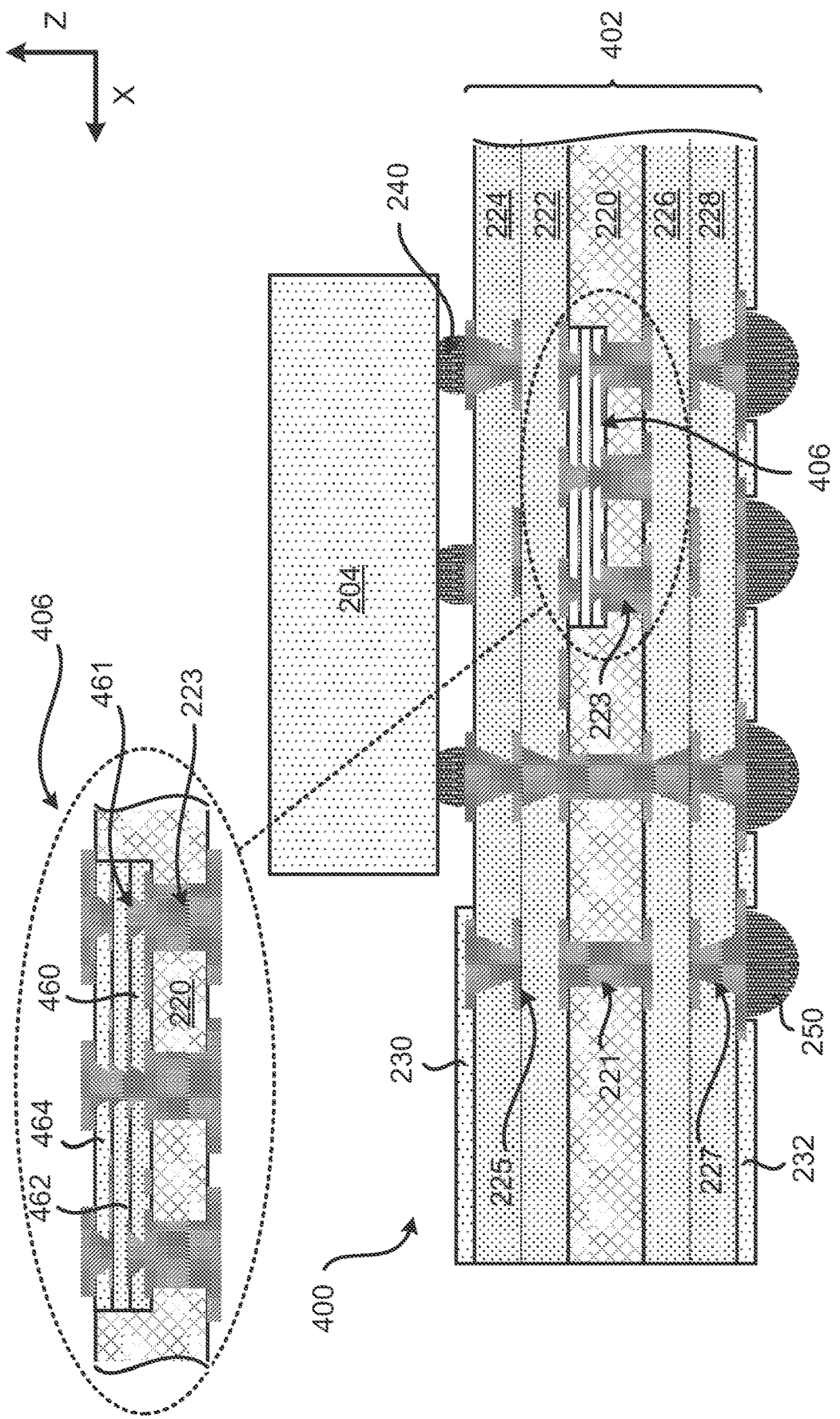
FIG. 4 illustrates a profile view of an integrated device coupled to another substrate that includes a high-density interconnect portion embedded in a core layer.

FIG. 4 illustrates a profile view of a package 400 that includes a substrate comprising a high-density interconnect portion located in a core layer. The package 400 is similar to the package 200 of FIG. 2 and includes the same or similar components as the package 200. The package 400 includes a substrate 402 and the integrated device 204. The integrated device 204 is coupled to the substrate 402 through the plurality of solder interconnects 240. The substrate 402 may be a laminate substrate that includes a core layer. As will be further described below, the high-density interconnect portion of the substrate 402 may have a different number of dielectric layers and/or high-density metal layers than the high-density interconnect portion 206 of FIG. 2.

The substrate 402 is similar to the substrate 202 and thus includes the same or similar components as the substrate 202. The substrate 402 includes a high-density interconnect portion 406. The high-density interconnect portion 406 is at least partially located in the core layer 220. The high-density interconnect portion 406 is configured to provide high density interconnects for the substrate 202. The high-density interconnect portion 406 includes a first dielectric layer 460 (e.g., first redistribution dielectric layer, first in-core dielectric layer), a second dielectric layer 462 (e.g., second redistribution dielectric layer, second in-core dielectric layer), a third dielectric layer 464 (e.g., third redistribution dielectric layer, third in-core dielectric layer) and a plurality of high-density interconnects 461 (e.g., redistribution interconnects). The high-density interconnect portion 406 may be means for high-density interconnection. The high-density interconnect portion 406 may be means for redistribution interconnection. The plurality of high-density interconnects 461 is located in the first dielectric layer 460, the second dielectric layer 462 and/or the third dielectric layer 464. The first dielectric layer 460, the second dielectric layer 462 and/or the third dielectric layer 464 may include the same materials as the first dielectric layer 260, the second dielectric layer 262. The plurality of high-density interconnects 461 is coupled to the second plurality of core interconnects 223 and the first plurality of interconnects 225.

Figure 5:
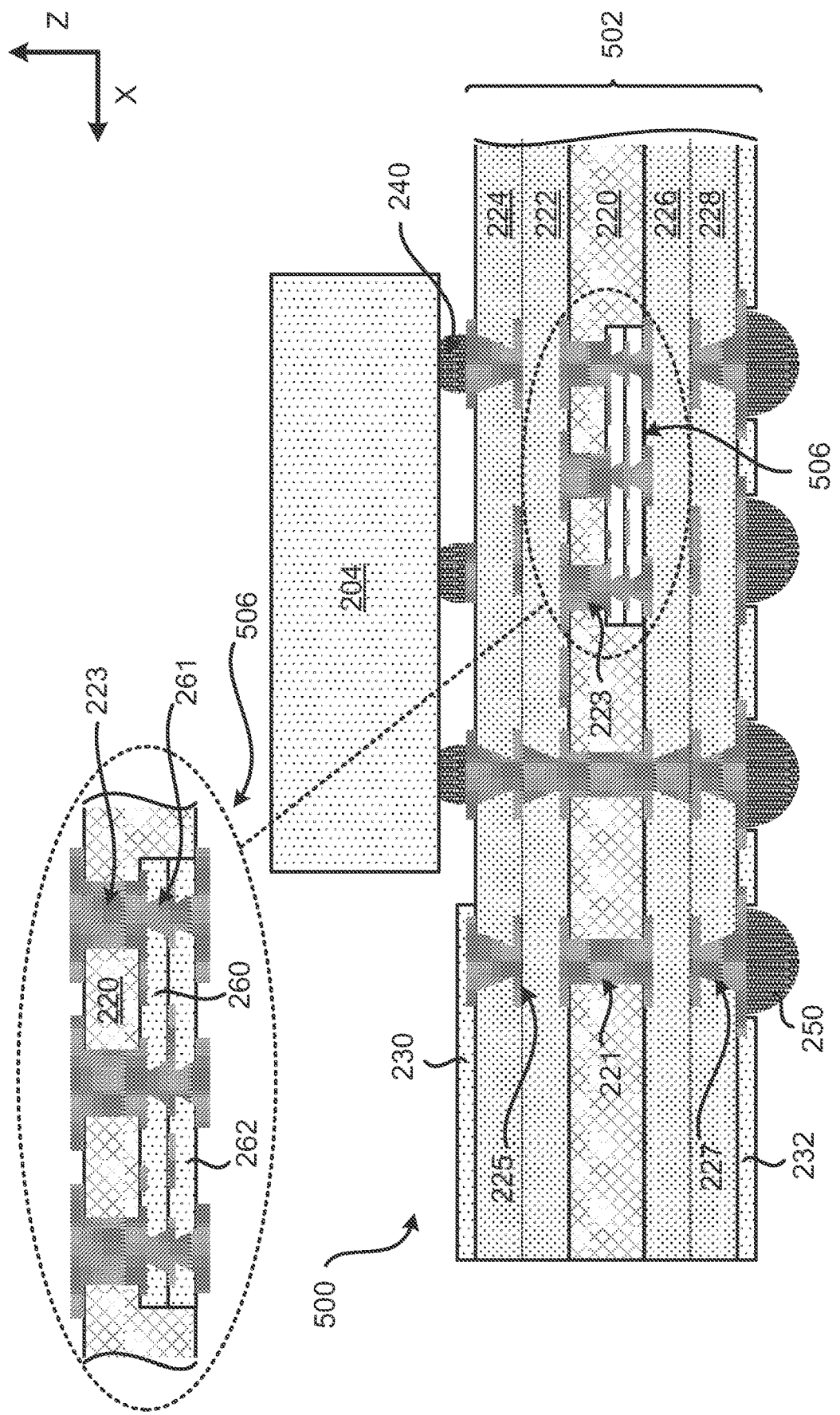
FIG. 5 illustrates a profile view of an integrated device coupled to another substrate that includes a high-density interconnect portion embedded in a core layer.

FIG. 5 illustrates a profile view of a package 500 that includes a substrate comprising a high-density interconnect portion located in a core layer. The package 500 is similar to the package 200 of FIG. 2 and includes the same or similar components as the package 200. The package 500 includes a substrate 502 and the integrated device 204. The integrated device 204 is coupled to the substrate 502 through the plurality of solder interconnects 240. The substrate 502 may be a laminate substrate that includes a core layer. As will be further described below, the high-density interconnect portion of the substrate 502 may located in a different location of the core layer than the high-density interconnect portion 206 of FIG. 2.

The substrate 502 is similar to substrate 202 and thus includes the same or similar components as the substrate 202. The substrate 502 includes a high-density interconnect portion 506. The high-density interconnect portion 506 is at least partially located in the core layer 220. For example, the high-density interconnect portion 506 is at least partially embedded through the second surface (e.g., bottom layer) of the core layer 220. The high-density interconnect portion 506 is configured to provide high density interconnects for the substrate 502. The high-density interconnect portion 506 includes the first dielectric layer 260, the second dielectric layer 262 and a plurality of high-density interconnects 261 (e.g., redistribution interconnects). The high-density interconnect portion 506 may be means for high-density interconnection. The high-density interconnect portion 506 may be means for redistribution interconnection. The plurality of high-density interconnects 261 is located in the first dielectric layer 260 and/or the second dielectric layer 262. The plurality of high-density interconnects 261 is coupled to the second plurality of core interconnects 223 and the second plurality of interconnects 227. The dielectric layer 226 may be coupled to the high-density interconnect portion 506.

Figure 6:
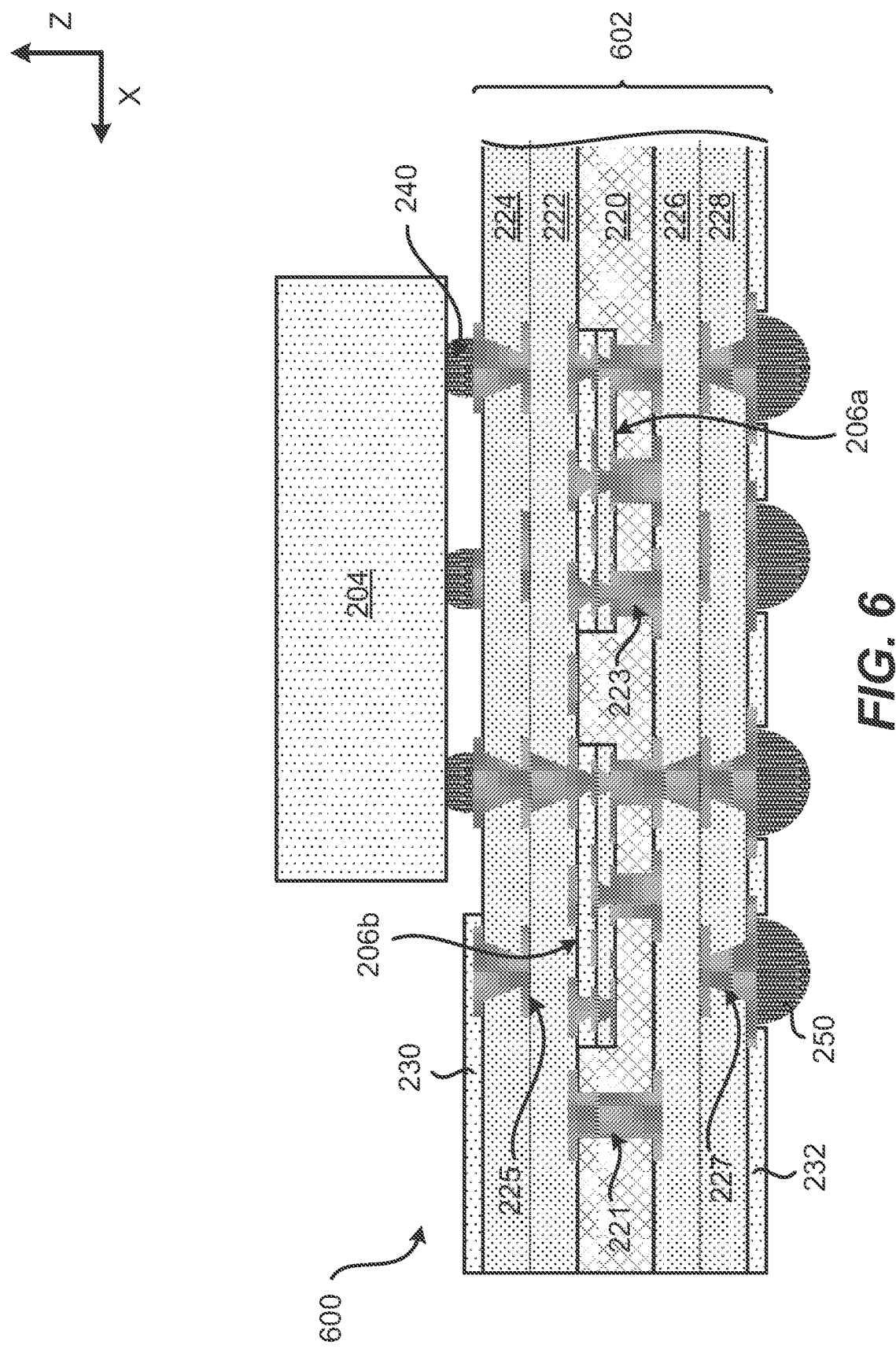
FIG. 6 illustrates a profile view of an integrated device coupled to another substrate that includes a high-density interconnect portion embedded in a core layer.

FIG. 6 illustrates a profile view of a package 600 that includes a substrate comprising a high-density interconnect portion located in a core layer. The package 600 is similar to the package 200 of FIG. 2 and includes the same or similar components as the package 200. The package 600 includes a substrate 602 and the integrated device 204. The integrated device 204 is coupled to the substrate 602 through the plurality of solder interconnects 240. The substrate 602 may be a laminate substrate that includes a core layer. As shown in FIG. 6, the substrate 602 includes multiple high-density interconnect portions. For example, the substrate 602 includes a first high-density interconnect portion 206a that is located in the core layer 220, and a second high-density interconnect portion 206b that is located in the core layer 220. Different implementations may include different numbers of high-density interconnect portions (e.g., redistribution portions) that are embedded through either or both surfaces (e.g., first surface, second surface) of the core layer 220. The high-density interconnect portions (e.g., 206a, 206b) may have similar or different sizes. The high-density interconnect portions (e.g., 206a, 206b) may have the same number or a different number of dielectric layers and/or high-density layers, as described in FIGS. 2 and 4. The high-density interconnect portions (e.g., 206a, 206b) may have high-density interconnects that have similar shapes and/or different shapes, as described in FIGS. 2 and 3.

Different implementations may have different thicknesses for the high-density interconnect portion (e.g., 206, 306, 406, 506) that is embedded in the core layer 220. It is noted that the teachings of any of the high-density interconnect portions may be implemented, combined, and/or substituted in any of the other high-density interconnect portions described in the disclosure.

The term "high-density interconnect(s)" may mean that the high-density interconnect(s) has/have a lower minimum line (e.g., width), minimum spacing and/or minimum pitch, than the minimum line (e.g., width), minimum spacing and/or minimum pitch of interconnects (e.g., core interconnects) in the core layer (e.g., 220) and/or the minimum line (e.g., width), minimum spacing and/or minimum pitch interconnects in the prepreg layers (e.g., 222, 224, 226, 228) of a substrate. In some implementations, the minimum line and minimum spacing (L/S) for the plurality of high-density interconnects from a high-density interconnect portion, may be in a range of approximately 2/2-20/20 micrometers (μm) (e.g., minimum L in range of 2-20 μm, minimum S in range of 2-20 μm). A minimum pitch may be defined as the minimum line (L) plus the minimum spacing (S).

Having described various substrates comprising various high-density interconnect portions, a sequence for fabricating a substrate that includes a high-density interconnect portion embedded in a core layer will now be described below.

Exemplary Sequence for Fabricating a Substrate Comprising a High-Density Interconnect Portion Embedded in a Core Layer FIGS. 7A-7F illustrate an exemplary sequence for providing or fabricating a substrate that includes a high-density interconnect portion that is located in a core layer. In some implementations, the sequence of FIGS. 7A-7F may be used to provide or fabricate the substrate 202 of FIG. 2, or any of the substrates described in the disclosure.

It should be noted that the sequence of FIGS. 7A-7F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 7A:
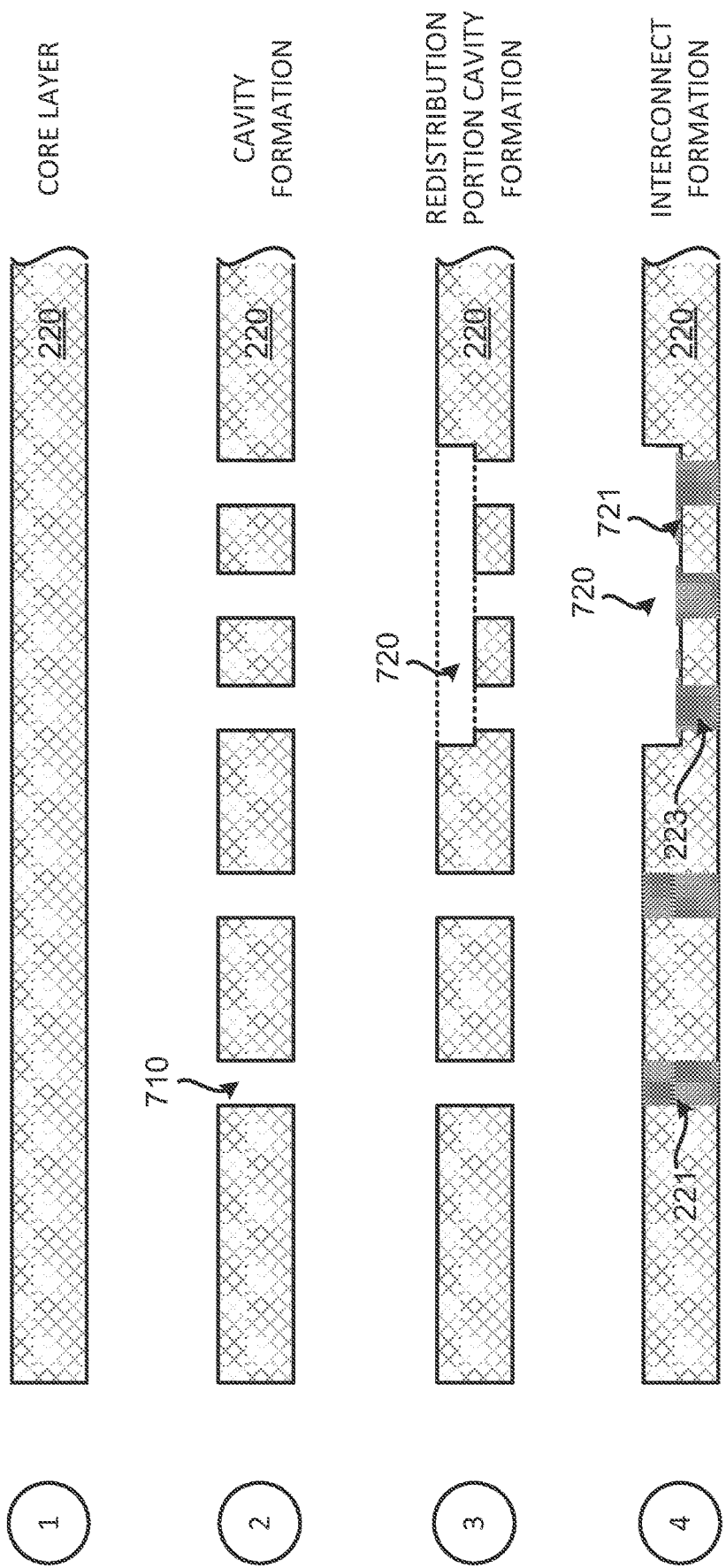
FIGS. 7A-7F illustrate an exemplary sequence for fabricating a substrate that includes a high-density interconnect portion embedded in a core layer.

Stage 1, as shown in FIG. 7A, illustrates a state after a core layer 220 is provided. The core layer 220 may include glass or glass fiber with resin. However, the core layer 220 may include different materials. The core layer 220 may have different thicknesses.

Stage 2 illustrates a state after a plurality of cavities 710 is formed in the core layer 220. The plurality of cavities 710 may be formed through a laser process and/or a drilling process. The plurality of cavities 710 may travel through the core layer 220.

Stage 3 illustrates a state after a redistribution portion cavity 720 is formed in the core layer 220. The redistribution portion cavity 720 may be formed through a first surface (e.g., top surface) of the core layer 220. In some implementations, the redistribution portion cavity 720 may be formed through a second surface (e.g., bottom surface) of the core layer 220. Different implementations may form different numbers of redistribution portion cavities. The redistribution portion cavities may have different depths.

Stage 4 illustrates a state after a plurality of core interconnects are formed in the plurality of cavities 710. For example, a first plurality of core interconnects 221 and a second plurality of core interconnects 223 may be formed in the plurality of cavities 710. A plating process may be used to form the first plurality of core interconnects 221 and the second plurality of core interconnects 223. However, different implementations may use different processes for forming the first plurality of core interconnects 221 and the second plurality of core interconnects 223. The first plurality of core interconnects 221 and the second plurality of core interconnects 223 may include core vias located in the core layer 220. A plurality of interconnects 721 may be formed in the cavity 720. The plurality of interconnects 721 may be coupled to the plurality of core interconnects 223. The plurality of interconnects 721 may be part of the plurality of high-density interconnects 261. In some implementations, the plurality of interconnects 721 may be formed in a separate process from the plurality of core interconnects 223.

Figure 7B:
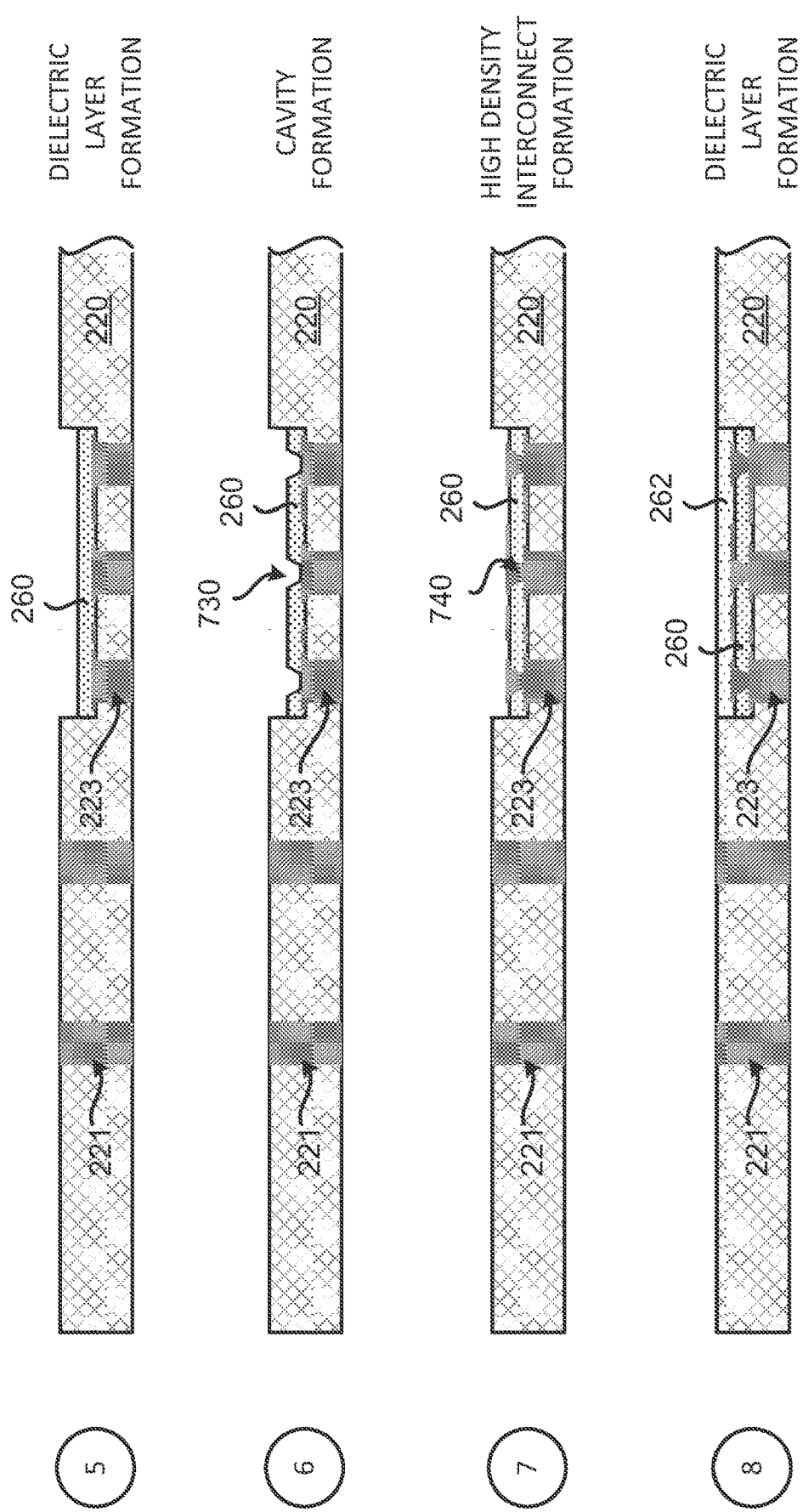

Stage 5, as shown in FIG. 7B, illustrates a state after a dielectric layer 260 (e.g. first redistribution dielectric layer, first in-core dielectric layer) is formed in the redistribution portion cavity 720. A deposition process may be used to form the dielectric layer 260. The dielectric layer 260 may include a photo imageable dielectric (PID) polymer. The dielectric layer 260 may include a different material than the core layer 220.

Stage 6 illustrates a state after a plurality of cavities 730 is formed in the dielectric layer 260. An etching process (e.g., photo etching process, photo lithography process) may be used to form the plurality of cavities 730.

Stage 7 illustrates a state after a first plurality of high-density interconnects 740 is formed over the dielectric layer 260 and/or in the plurality of cavities 730. The first plurality of high-density interconnects 740 may include a seed layer and a metal layer. A plating process may be used to form the first plurality of high-density interconnects 740. In some implementations, at least some of the first plurality of high-density interconnects 740 may include a U-shape interconnect or a V-shape interconnect. The first plurality of high-density interconnects 740 may define a first metal layer of a high-density interconnect portion. The first plurality of high-density interconnects 740 may be coupled to the second plurality of core interconnects 223.

Stage 8 illustrates a state after a dielectric layer 262 (e.g. second redistribution dielectric layer, second in-core dielectric layer) is formed in the redistribution portion cavity 720. The dielectric layer 262 may be formed over and coupled to the dielectric layer 260 (e.g. first dielectric layer). A deposition process may be used to form the dielectric layer 262. The dielectric layer 260 may include a photo imageable dielectric (PID) polymer. The dielectric layer 262 may include a similar material than the dielectric layer 260. The dielectric layer 262 may include a different material than the core layer 220.

Figure 7C:
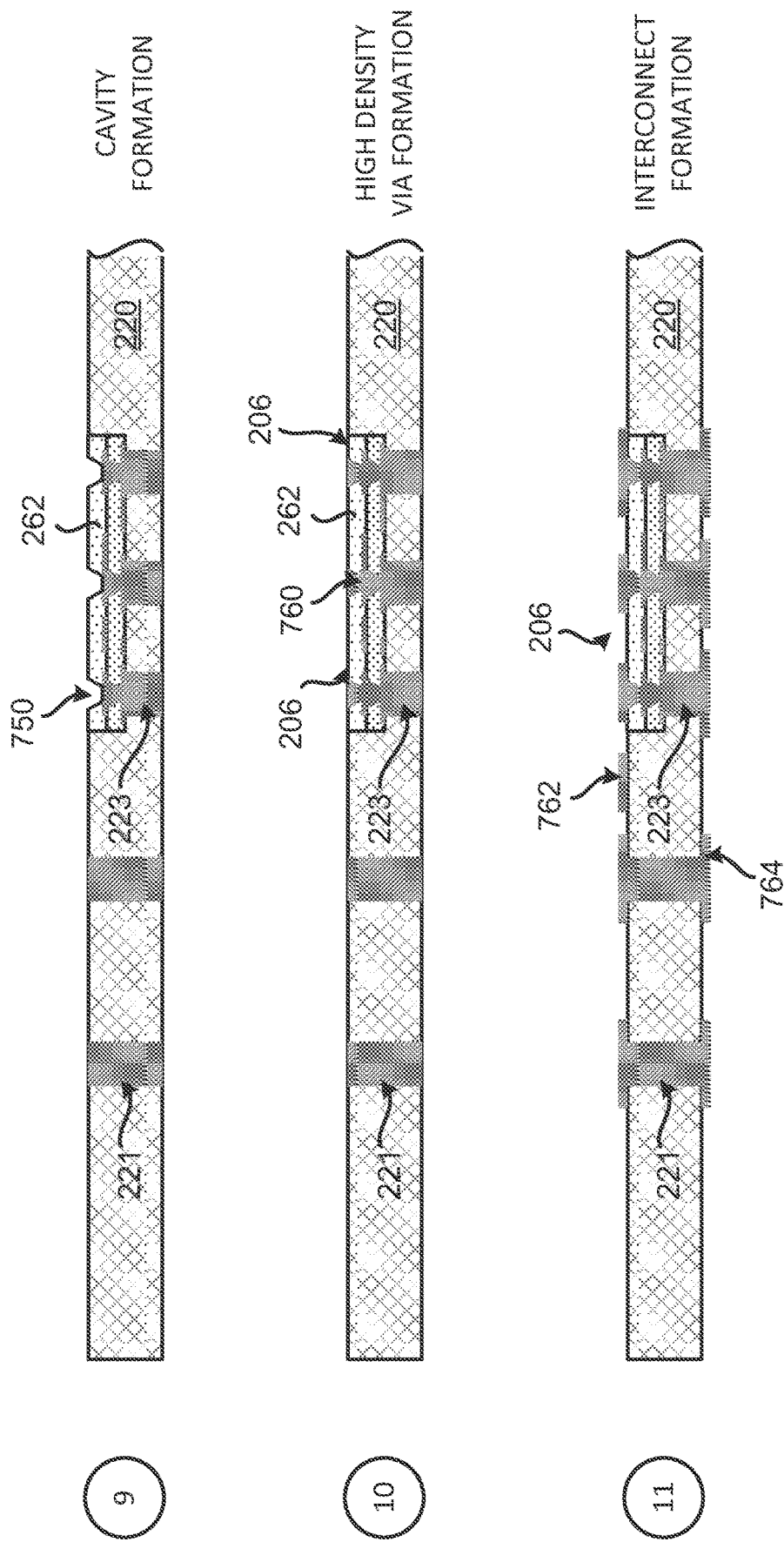

Stage 9, as shown in FIG. 7C, illustrates a state after a plurality of cavities 750 is formed in the dielectric layer 262. An etching process (e.g., photo etching process, photo lithography process) may be used to form the plurality of cavities 750.

Stage 10 illustrates a state after a second plurality of high-density interconnects 760 is formed in the dielectric layer 262 and/or in the plurality of cavities 750. The second plurality of high-density interconnects 760 may include a seed layer and a metal layer. A plating process may be used to form the second plurality of high-density interconnects 760. In some implementations, the second plurality of high-density interconnects 760 may include a U-shape interconnect or a V-shape interconnect. The second plurality of high-density interconnects 760 may define a second metal layer of a high-density interconnect portion. The second plurality of high-density interconnects 760 may be coupled to the first plurality of high-density interconnects 740. In some implementations, the second plurality of high-density interconnects 760 may be formed over the dielectric layer 262.

Stage 10 may illustrate the high-density interconnect portion 206 that is at least partially embedded in the core layer 220. The high-density interconnect portion 206 includes the dielectric layer 260 (e.g., redistribution dielectric layer, in-core dielectric layer), the dielectric layer 262 (e.g., redistribution dielectric layer, in-core dielectric layer), the plurality of high-density interconnects 760 and the plurality of high-density interconnects 740. The plurality of high-density interconnects 760 and the plurality of high-density interconnects 740 may be represented by the plurality of high-density interconnects 261, as described in FIG. 2.

Stage 11 illustrates a state after a plurality of interconnects 762 is formed over the first surface (e.g., top surface) of the core layer 220 and the high-density interconnect portion 206. The plurality of interconnects 762 may be coupled to the first plurality of core interconnects 221 and the plurality of high-density interconnects 261 of the high-density interconnect portion 206. Stage 11 also illustrates a state after a plurality of interconnects 764 is formed over the second surface (e.g., bottom surface) of the core layer 220. The plurality of interconnects 764 may be coupled to the first plurality of core interconnects 221 and the second plurality of core interconnects 223. A patterning process, a stripping process and/or a plating process may be used to form the plurality of interconnects 762 and the plurality of interconnects 764.

Figure 7D:
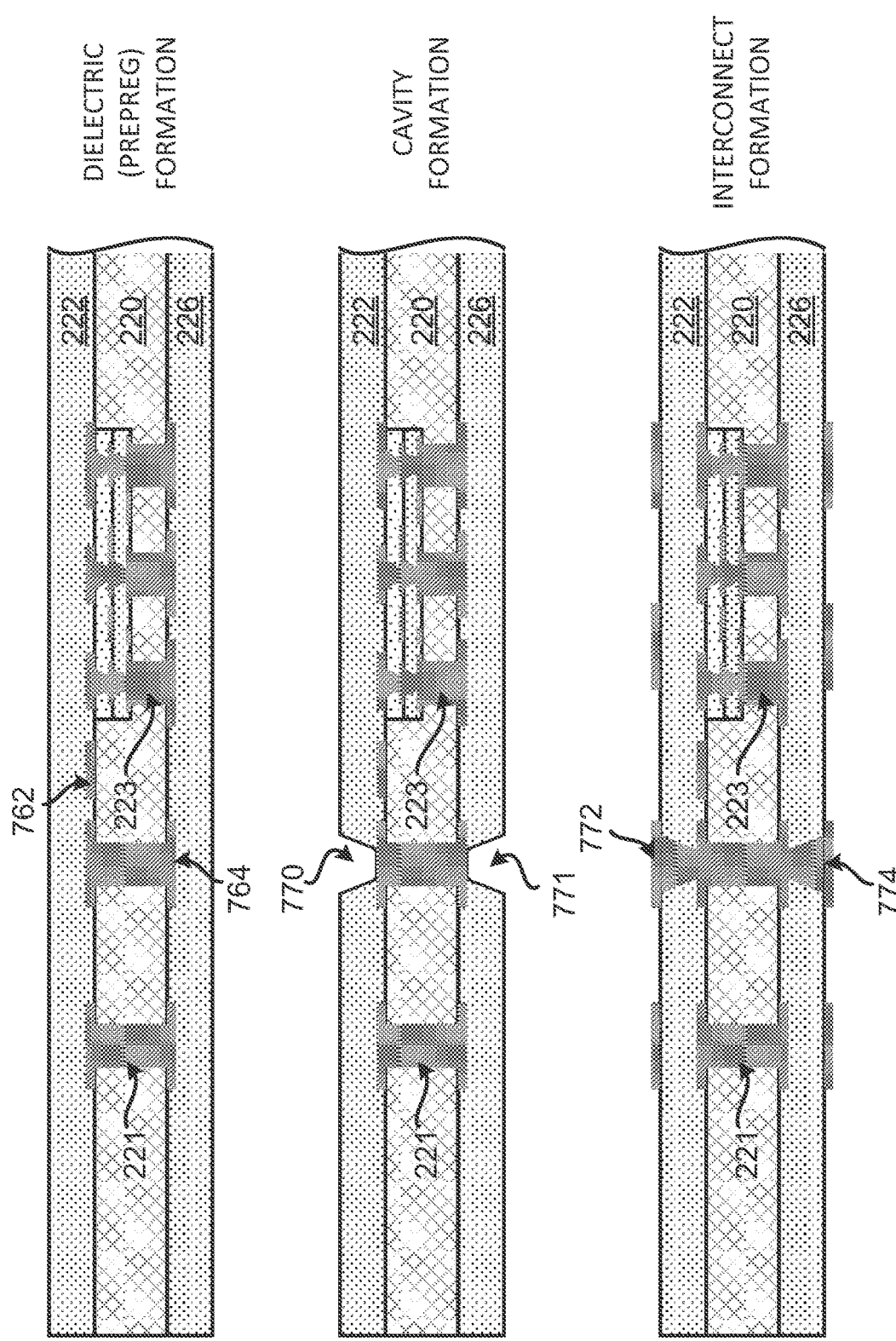

Stage 12, as shown in FIG. 7D, illustrates a state after a dielectric layer 222 is formed over the first surface of the core layer 220, and a dielectric layer 226 is formed over the second surface of the core layer 220. A deposition process and/or lamination process may be used to form dielectric layers 222 and 226. The dielectric layers 222 and 226 may include prepreg (e.g., prepreg layers).

Stage 13 illustrates a state after a plurality of cavities 770 is formed in the dielectric layer 222, and a plurality of cavities 771 is formed in the dielectric layer 226. A laser process (e.g., laser drilling, laser ablation) may be used to form the plurality of cavities 770 and the plurality of cavities 771.

Stage 14 illustrates a state after a plurality of interconnects 772 is formed over and coupled to the dielectric layer 222 and the plurality of cavities 770. The plurality of interconnects 772 may be coupled to the plurality of interconnects 762. Stage 11 also illustrates a state after a plurality of interconnects 774 is formed over and coupled the dielectric layer 226 and the plurality of cavities 771. The plurality of interconnects 774 may be coupled to the plurality of interconnects 764. A patterning process, a stripping process and/or a plating process may be used to form the plurality of interconnects 772 and the plurality of interconnects 774.

Figure 7E:
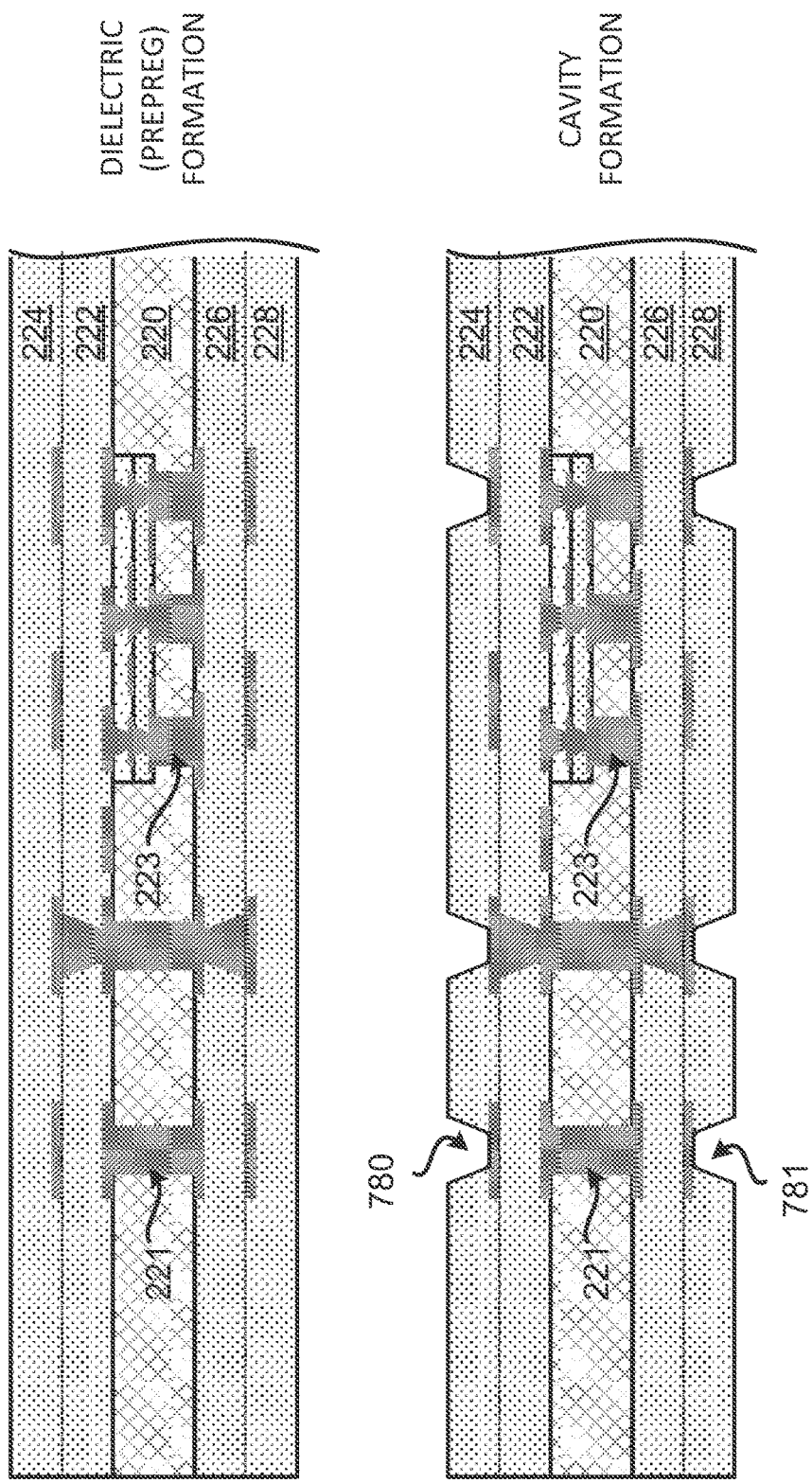

Stage 15, as shown in FIG. 7E, illustrates a state after a dielectric layer 224 is formed over and coupled to a first surface of dielectric layer 222, and a dielectric layer 228 is formed over and coupled to a second surface of the dielectric layer 226. A deposition process and/or lamination process may be used to form dielectric layers 224 and 228. The dielectric layers 224 and 228 may include prepreg (e.g., prepreg layers).

Stage 16 illustrates a state after a plurality of cavities 780 is formed in the dielectric layer 224, and a plurality of cavities 781 is formed in the dielectric layer 228. A laser process (e.g., laser drilling, laser ablation) may be used to form the plurality of cavities 780 and the plurality of cavities 781.

Figure 7F:
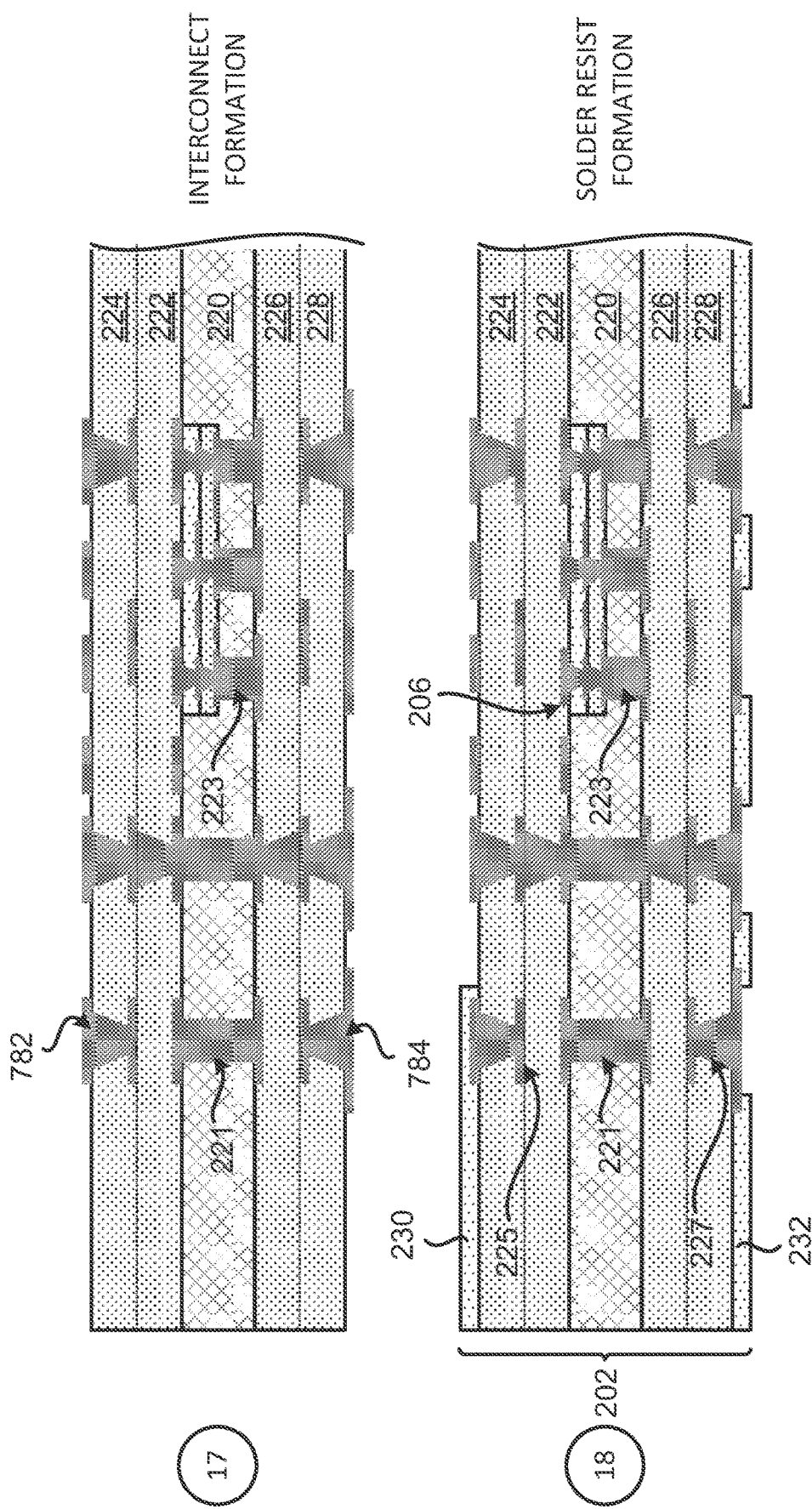

Stage 17, as shown in FIG. 7F, illustrates a state after a plurality of interconnects 782 is formed over and coupled to the dielectric layer 224 and the plurality of cavities 780. The plurality of interconnects 782 may be coupled to the plurality of interconnects 772. Stage 17 also illustrates a state after a plurality of interconnects 784 is formed over and coupled to the dielectric layer 228 and the plurality of cavities 781. The plurality of interconnects 784 may be coupled to the plurality of interconnects 774. A patterning process, a stripping process and/or a plating process may be used to form the plurality of interconnects 782 and the plurality of interconnects 784.

Stage 18 illustrates a state after (i) the solder resist layer 230 is formed over the dielectric layer 224, and (ii) the solder resist layer 232 is formed over the dielectric layer 228. A deposition process may be used the solder resist layer 230 and the solder resist layer 232.

Stage 18 may illustrate the substrate 202 that includes a high-density interconnect portion 206 (e.g., redistribution portion) that is at least partially located in the core layer 220. The first plurality of interconnects 225 may represent the plurality of interconnects 782, the plurality of interconnects 772 and/or the plurality of interconnects 762. The second plurality of interconnects 227 may represent the plurality of interconnects 784, the plurality of interconnects 774 and/or the plurality of interconnects 764.

Figure 8:
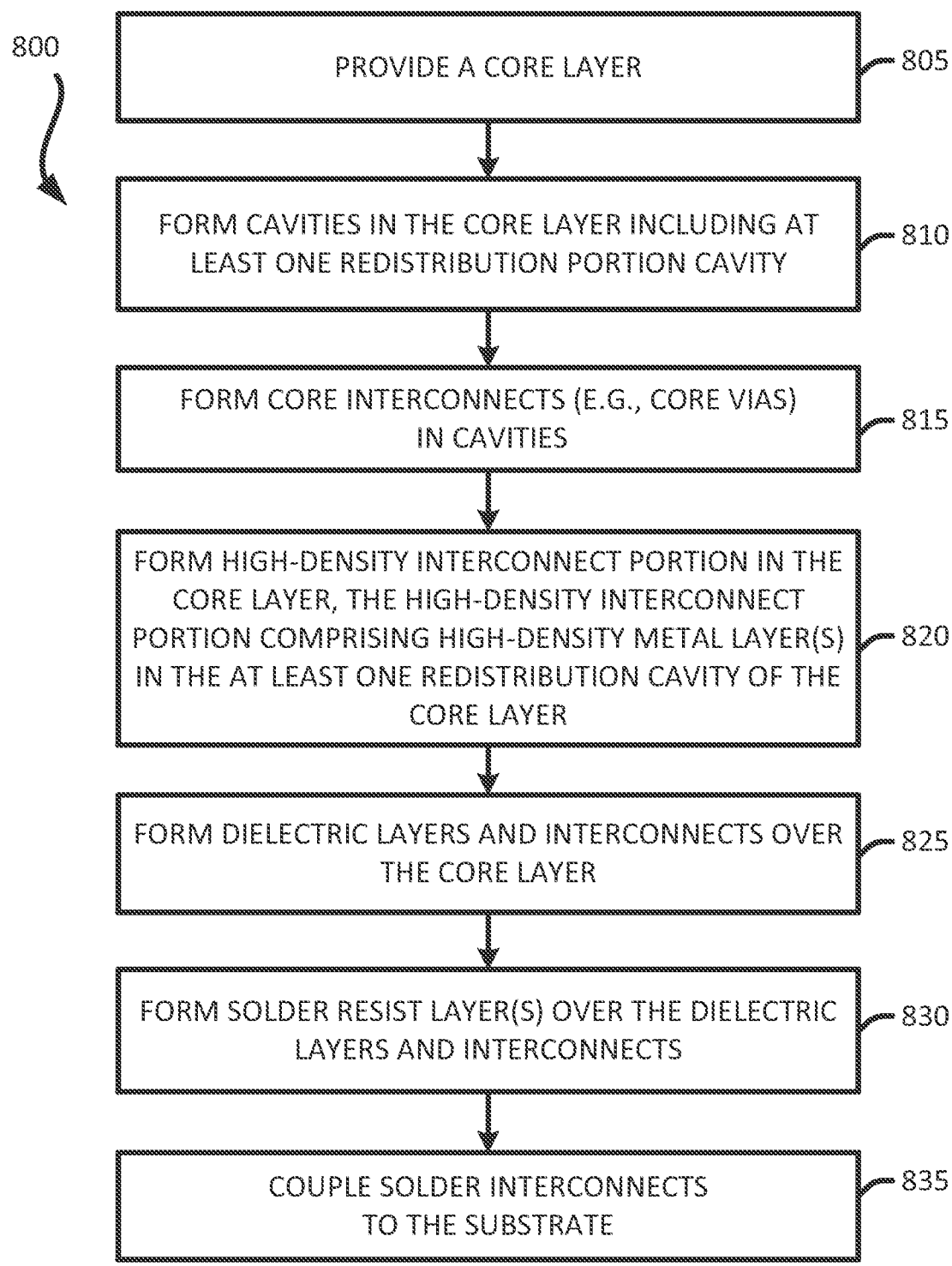
FIG. 8 illustrates an exemplary flow diagram of a method for fabricating a substrate that includes a high-density interconnect portion embedded in a core layer.

Exemplary Flow Diagram of a Method for Fabricating a Substrate Comprising a High-Density Portion Embedded in a Core Layer In some implementations, fabricating a substrate includes several processes. FIG. 8 illustrates an exemplary flow diagram of a method 800 for providing or fabricating a substrate. In some implementations, the method 800 of FIG. 8 may be used to provide or fabricate the substrate of FIG. 2. For example, the method of FIG. 8 may be used to fabricate the substrate 202. However, the method of FIG. 8 may be used fabricate any substrate in the disclosure.

It should be noted that the method of FIG. 8 may combine one or more processes in order to simplify and/or clarify the method for providing or fabricating a substrate. In some implementations, the order of the processes may be changed or modified.

The method provides (at 805) a core layer (e.g., 220). The core layer 220 may include glass or glass fiber with resin. However, the core layer 220 may include different materials. The core layer 220 may have different thicknesses. Stage 1 of FIG. 7A illustrates an example of a core layer that is provided.

The method forms (at 810) a plurality of cavities (e.g., 710) in the core layer, including forming at least one redistribution portion cavity (e.g., 720). A laser process or a drilling process may be used to form the cavities. The plurality of cavities may travel through the core layer 220. The redistribution portion cavity (e.g., 720) may be formed through a first surface (e.g., top surface) or a second surface (e.g., bottom surface) of the core layer 220. Different implementations may form a different number of redistribution portion cavities in the core layer. The redistribution portion cavities may have different depths. Stages 2 and 3 of FIG. 7A illustrate examples of forming cavities in the core layer.

The method form (at 815) a plurality of core interconnects (e.g., 221, 223) in the plurality of cavities (e.g., 710). For example, a first plurality of core interconnects 221 and a second plurality of core interconnects 223 may be formed in the plurality of cavities 710. A plating process may be used to form the first plurality of core interconnects 221 and the second plurality of core interconnects 223. However, different implementations may use different processes for forming the first plurality of core interconnects 221 and the second plurality of core interconnects 223. The first plurality of core interconnects 221 and the second plurality of core interconnects 223 may include core vias located in the core layer 220. Stage 4 of FIG. 7A illustrates an example of core interconnects located in the core layer.

The method forms (at 820) at least one high-density interconnect portion (e.g., 206) in the redistribution portion cavity of the core layer (e.g., 220). The high-density interconnect portion may include at least one dielectric layer (e.g., 260, 262) and a plurality of high-density interconnects (e.g., 261). The plurality of high-density interconnects may be one or more patterned high-density metal layers. Forming the high-density interconnect portion (e.g., redistribution portion) may include a deposition process, a patterning process, an etching process, a stripping process, and/or a plating process. A dielectric layer (e.g., redistribution dielectric layer, in-core dielectric layer) of the high-density interconnect portion may include a photo imageable dielectric (PID) polymer. A dielectric layer may include a different material than the core layer 220. At least one dielectric layer may be deposited, at least cavity may be formed in the at least one dielectric layer, and a plating process may be used to form the plurality of high-density interconnects. In some implementations, at least some of the high-density interconnects may include a U-shape interconnect or V-shape interconnect. Stages 5-10 of FIGS. 7B-7C illustrate an example of forming a high-density interconnect portion located in a core layer.

The method forms (at 825) a plurality of interconnects (e.g., 225, 227) and at least one dielectric layer (e.g., 222, 224) over a first surface of the core layer and a second surface of the core layer (e.g., 220). A patterning process, a stripping process and/or a plating process may be used to form the plurality of interconnects. A laser process (e.g., laser drilling, laser ablation) may be used to form the plurality of cavities in a dielectric layer. A deposition process and/or a lamination process may be used to form at least one dielectric layer. The at least one dielectric layer may include prepreg (e.g., prepreg layer). Stages 11-17 of FIGS. 7C-7F illustrate examples of forming a plurality of interconnects and at least one dielectric layer (e.g., prepreg).

The method forms (at 830) at least one solder resist layer (e.g., 230) over a first surface of a dielectric layer, and at least one solder resist layer (e.g., 232) over a second surface of a dielectric layer. A deposition process may be used the solder resist layer 230 and the solder resist layer 232. Stage 18 of FIG. 7F illustrates an example of forming solder resist layers over dielectric layers.

The method may couple (at 835) a plurality of solder interconnects (e.g., 250) to the substrate (e.g., 202). For example, a reflow process may be used to couple the plurality of solder interconnects 250 to the plurality of interconnects 227 of the substrate 202.

Exemplary Electronic Devices

Figure 9:
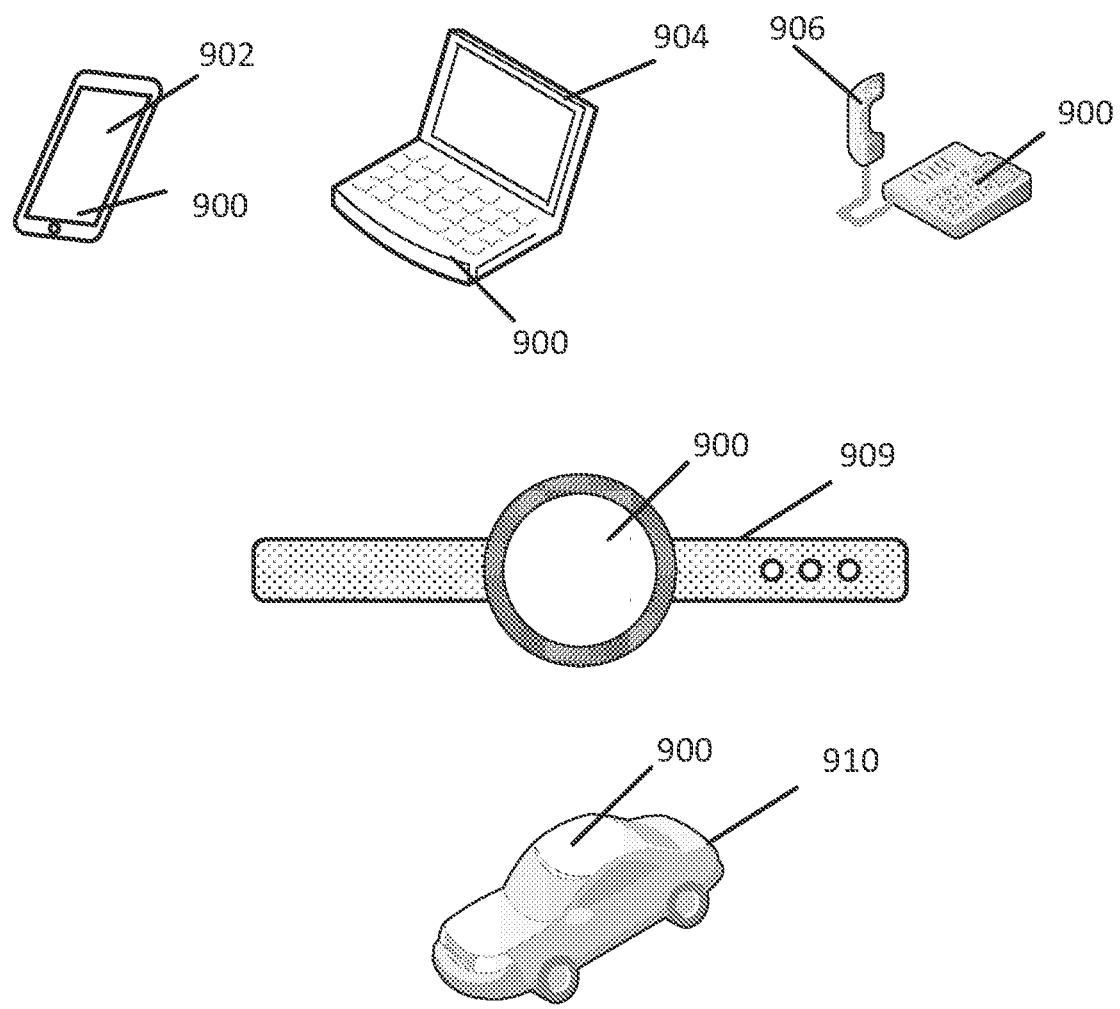
FIG. 9 illustrates various electronic devices that may integrate a die, an electronic circuit, an integrated device, an integrated passive device (IPD), a passive component, a package, and/or a device package described herein.

FIG. 9 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 902, a laptop computer device 904, a fixed location terminal device 906, a wearable device 908, or automotive vehicle 910 may include a device 900 as described herein. The device 900 may be, for example, any of the devices and/or integrated circuit (IC) packages described herein. The devices 902, 904, 906 and 908 and the vehicle 910 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 7A-7F, and/or 8-9 may be rearranged and/or combined into a single component, process, feature or function or embodied in several components, processes, or functions. Additional elements, components, processes, and/or functions may also be added without departing from the disclosure. It should also be noted FIGS. 2-6, 7A-7F, and/or 8-9 and its corresponding description in the present disclosure is not limited to dies and/or ICs. In some implementations, FIGS. 2-6, 7A-7F, and/or 8-9 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A substrate comprising:
a core layer comprising a first surface and a second surface;
a first dielectric layer coupled to the first surface of the core layer;
a first plurality of interconnects located in the first dielectric layer;
a second dielectric layer coupled to the second surface of the core layer;
a second plurality of interconnects located in the second dielectric layer;
a high-density interconnect portion located in the core layer,
wherein the high-density interconnect portion is coupled to the first plurality of interconnects located in the first dielectric layer, and
wherein the high-density interconnect portion comprises:
a first in-core dielectric layer that touches the core layer; and
a first plurality of high-density interconnects located in the first in-core dielectric layer; and
a plurality of core interconnects located in the core layer,
wherein the plurality of core interconnects includes at least one core interconnect coupled to the high-density interconnect portion and the second plurality of interconnects located in the second dielectric layer, and
wherein the at least one core interconnect is located in the core layer and extends from the second surface of the core layer to the high-density interconnect portion in the core layer.

2. The substrate of claim 1, wherein the first in-core dielectric layer includes a different material than the core layer.

3. The substrate of claim 1,
wherein the first plurality of interconnects comprises a first minimum pitch, and
wherein the first plurality of high-density interconnects comprises a second minimum pitch that is less than the first minimum pitch.

4. The substrate of claim 1, wherein the first plurality of high-density interconnects is coupled to at least one core interconnect from the plurality of core interconnects.

5. The substrate of claim 1, wherein the high-density interconnect portion further comprises:
a second in-core dielectric layer; and
a second plurality of high-density interconnects located in the second in-core dielectric layer.

6. The substrate of claim 5,
wherein the first plurality of high-density interconnects is coupled to at least one core interconnect; and
wherein the second plurality of high-density interconnects is coupled to the first plurality of high-density interconnects and the first plurality of interconnects.

7. The substrate of claim 1, wherein the first in-core dielectric layer comprises a photo imageable dielectric (PID) polymer.

8. The substrate of claim 1, wherein the first dielectric layer and the second dielectric layer each includes a prepreg layer.

9. The substrate of claim 1,
wherein the first plurality of interconnects is coupled to the second plurality of interconnects through the high-density interconnect portion and the at least one core interconnect that extends from the second surface of the core layer to the high-density interconnect portion in the core layer, and
wherein the at least one core interconnect is located between the high-density interconnect portion and the second plurality of interconnects.

10. The substrate of claim 1, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. An apparatus comprising:
an integrated device; and
a substrate coupled to the integrated device, the substrate comprising:
a core layer comprising a first surface and a second surface;
a first dielectric layer coupled to the first surface of the core layer;
means for first interconnection located in the first dielectric layer;
a second dielectric layer coupled to the second surface of the core layer;
means for second interconnection located in the second dielectric layer;

means for high-density interconnection located in the core layer,
  wherein the means for high-density interconnection is coupled to the first plurality of interconnects located in the first dielectric layer, and
  wherein the means for high-density interconnection comprises:
    a first in-core dielectric layer that touches the core layer; and
    a first plurality of high-density interconnects located in the first in-core dielectric layer; and
means for core interconnection located in the core layer,
  wherein the means for core interconnection located in the core layer includes at least one core interconnect coupled to the means for high-density interconnection and the second plurality of interconnects located in the second dielectric layer, and
  wherein the at least one core interconnect is located in the core layer and extends from the second surface of the core layer to the means for high-density interconnection in the core layer.

12. The apparatus of claim 11, wherein the first in-core dielectric layer includes a different material than the core layer.

13. The apparatus of claim 11,
  wherein the means for first interconnection comprises a first plurality of interconnects comprising a first minimum pitch, and
  wherein the first plurality of high-density interconnects comprises a second minimum pitch that is less than the first minimum pitch.

14. The apparatus of claim 11, wherein the first plurality of high-density interconnects is coupled to the means for core interconnection.

15. The apparatus of claim 11, wherein the means for high-density interconnection further comprises:
  a second in-core dielectric layer; and
  a second plurality of high-density interconnects located in the second in-core dielectric layer.

16. The apparatus of claim 15,
  wherein the first plurality of high-density interconnects is coupled to the means for core interconnection; and
  wherein the second plurality of high-density interconnects is coupled to the first plurality of high-density interconnects and the means for first interconnection.

17. The apparatus of claim 11, wherein the first in-core dielectric layer comprises a photo imageable dielectric (PID) polymer.

18. The apparatus of claim 11, wherein the first dielectric layer and the second dielectric layer each includes a prepreg layer.

19. The apparatus of claim 11,
  wherein the first plurality of interconnects is coupled to the second plurality of interconnects through the means for high-density interconnection and the at least one core interconnect that extends from the second surface of the core layer to the means for high-density interconnection in the core layer, and
  wherein the at least one core interconnect is located between the means for high-density interconnection and the second plurality of interconnects.

20. The apparatus of claim 11, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *